United States Patent
Chu

(10) Patent No.: US 7,420,871 B2
(45) Date of Patent: Sep. 2, 2008

(54) SYNCHRONOUS SEMICONDUCTOR MEMORY DEVICE

(75) Inventor: Yong-Gyu Chu, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 87 days.

(21) Appl. No.: 11/609,865

(22) Filed: Dec. 12, 2006

(65) Prior Publication Data

US 2007/0147167 A1    Jun. 28, 2007

(30) Foreign Application Priority Data

Dec. 26, 2005    (KR) ............... 10-2005-0130012

(51) Int. Cl.
*G11C 8/00* (2006.01)
(52) U.S. Cl. .................... 365/233.1; 365/194
(58) Field of Classification Search ........... 365/233.1, 365/194, 189.04
See application file for complete search history.

(56) References Cited

U.S. PATENT DOCUMENTS

| | | | |
|---|---|---|---|
| 6,687,185 B1 | 2/2004 | Keeth et al. | |
| 7,012,850 B2 * | 3/2006 | Demone | 365/230.06 |
| 7,065,003 B2 * | 6/2006 | Lee et al. | 365/194 |
| 7,292,500 B2 * | 11/2007 | Liu et al. | 365/233.1 |
| 2005/0270852 A1 * | 12/2005 | Dietrich et al. | 365/189.01 |

FOREIGN PATENT DOCUMENTS

| | | |
|---|---|---|
| JP | 11-203859 | 7/1999 |
| KR | 2000-0045402 | 7/2000 |

OTHER PUBLICATIONS

English language abstract for Korean Publication No. 2000-0045402.
English language abstract for Japanese Publication No. 11-203859.

* cited by examiner

*Primary Examiner*—Anh Phung
(74) *Attorney, Agent, or Firm*—Marger Johnson & McCollom, P.C.

(57) ABSTRACT

Provided is a synchronous semiconductor memory device with improved latency control. In one embodiment, the synchronous semiconductor memory device may include a clock synchronizing circuit, a latency circuit, and a latency control circuit. The clock synchronizing circuit may receive an external clock signal and output a data output clock signal. The latency circuit may store a read signal in response to at least one sampling clock signal, generate a plurality of clock control signals in a sequential manner, generate a plurality of transfer clock signals synchronized with the plurality of clock control signals, and supply a latency signal in response to the transfer clock signals. The latency control circuit may delay the plurality of clock control signals by the sum of output delay time and the read command delay time so as to generate a plurality of sampling clock signals synchronized with the plurality of delayed clock control signals.

20 Claims, 7 Drawing Sheets

SYNCHRONOUS SEMICONDUCTOR MEMORY DEVICE

CROSS-REFERENCE TO RELATED APPLICATION

This application claims priority from Korean Patent Application No. 10-2005-0130012 filed on Dec. 26, 2005 in the Korean Intellectual Property Office, the disclosure of which is incorporated herein by reference in its entirety.

BACKGROUND

1. Field of the Invention

The present invention relates to a synchronous semiconductor memory device, and more particularly, to a synchronous semiconductor memory device with improved latency control.

2. Description of the Related Art

A synchronous semiconductor memory device inputs/outputs data in synchronization with an external clock signal. Since the external interface of the synchronous semiconductor memory device is synchronized with the external clock signal, it is possible to set it beforehand so that the clock cycle effective data can be output after a controller orders a read command.

CAS latency refers to a period of time from when a read command or a column address is input to a synchronous semiconductor memory device until a time when data is output. The CAS latency is generally expressed as a multiple of an external clock cycle tCC. That is, when the read command (the column address supplied together with the read command) is received, data is output from the synchronous semiconductor memory device after a number of clock cycles corresponding to the CAS latency pass. For example, assuming that the CAS latency is 5, data should be output in synchronization with an external clock cycle generated after five clock cycles from an external clock cycle from which a read command is applied.

Therefore, the synchronous semiconductor memory device should read out data in response to the read command and then output the data after predetermined clock cycles, that is, clock cycles corresponding to the set CAS latency.

A latency circuit generates a latency signal for controlling the CAS latency so that data can be output after predetermined clock cycles in the synchronous semiconductor memory device. The latency circuit internally uses a transfer clock signal and a sampling clock signal in order to generate the latency signal. The transfer clock signal is a clock signal generated in synchronization with a data output clock signal that is obtained by passing an external clock signal through a variable delay circuit DLL. In addition, the sampling clock signal is a clock signal obtained by buffering the external clock signal and passing the external clock signal through another variable delay circuit. A predetermined time difference should be maintained between the transfer clock signal and the sampling clock signal. However, in the synchronous semiconductor memory device operating at a high-frequency, an early-stage operation of a variable delay circuit may not be stable. Accordingly, it is difficult to maintain the predetermined time difference between the transfer clock signal and the sampling clock signal which have passed through different variable delay circuits. As a result, an operational failure may occur in the synchronous semiconductor memory device.

SUMMARY

An object of the present invention is to provide a semiconductor memory device with improved latency control. In order to achieve this object and other objects of the present invention, one embodiment of the present invention is directed to a synchronous semiconductor memory device that includes a clock synchronizing circuit, a latency circuit, and a latency control circuit.

The clock synchronizing circuit receives an external clock signal and outputs a data output clock signal. The latency circuit stores a read signal in response to at least one sampling clock signal, receives the data output clock signal and then generates a plurality of clock control signals in a sequential manner, generates a plurality of transfer clock signals synchronized with the plurality of clock control signals, and supplies a latency signal in response to the transfer clock signals associated with the sampling clock signals used to store the read signal. The latency control circuit delays the plurality of clock control signals by the sum of output delay time and read command delay time so as to generate a plurality of sampling clock signals synchronized with the plurality of delayed clock control signals.

BRIEF DESCRIPTION OF THE DRAWINGS

The above and other features and advantages of the present invention will become more apparent by describing in detail preferred embodiments thereof with reference to the attached drawings, in which.

DETAILED DESCRIPTION

Figure 1:
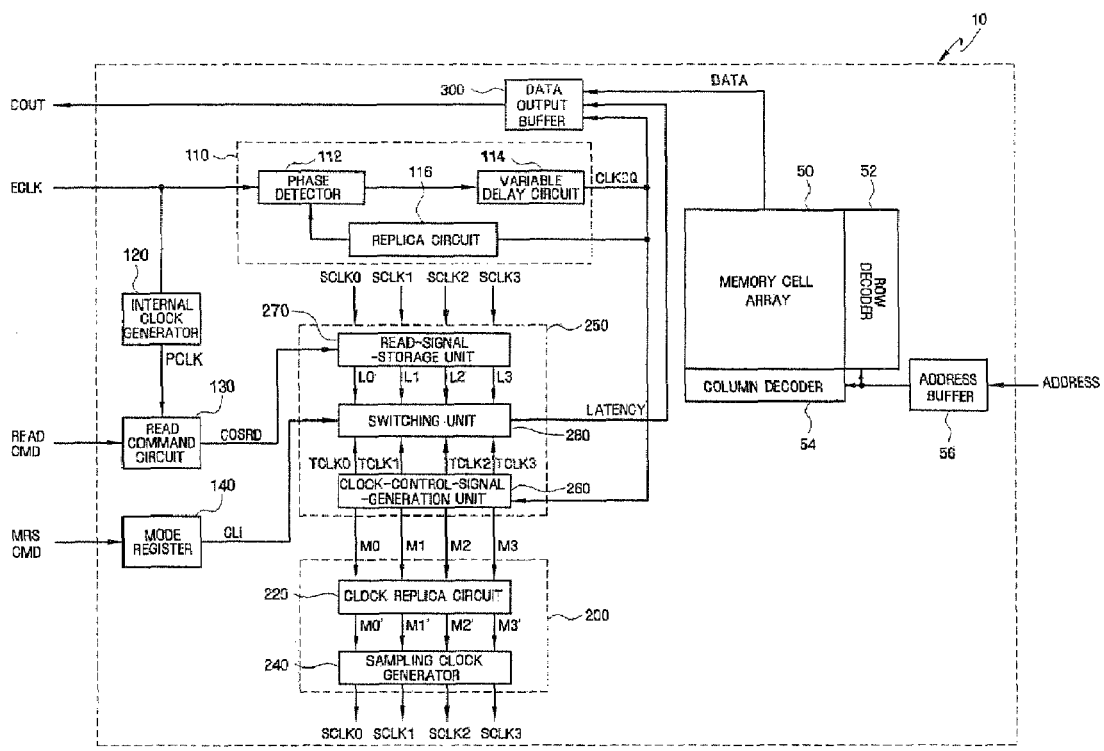
FIG. 1 is a block diagram illustrating a synchronous semiconductor memory device according to an embodiment of the present invention.

Advantages and features of the present invention and methods of accomplishing the same may be understood more readily by reference to the following detailed description of embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the present invention to those skilled in the art. However, the scope of the present invention will only be defined by the appended claims. Like reference numerals refer to like elements throughout the specification.

FIG. 1 is a block diagram illustrating a synchronous semiconductor memory device according to an embodiment of the present invention.

In the embodiment of the present invention illustrated in FIG. 1, a synchronous semiconductor memory device is provided in which a sampling clock signal is generated by using a clock control signal synchronized with a data output clock signal.

Referring to FIG. 1, a synchronous semiconductor memory device 10 according to the above embodiment of the present invention includes a clock synchronizing circuit 110, a latency control circuit 200, a latency circuit 250, and a data output buffer 300.

Data DATA is written in a memory cell array 50 or read out from the memory cell array 50 to be output to an external device. When a read command READ CMD is input to the synchronous semiconductor memory device 10, the data is output from the memory cell array 50 corresponding to an address ADDRESS, which may be externally supplied. Specifically, an address buffer 56 receives an external address and temporarily stores the received address. A row decoder 52 receives the address stored in the address buffer 56 and decodes a row address of the memory cell array 50 on the basis of the received address. A column decoder 54 receives the address stored in the address buffer 56 and decodes a column address of the memory cell array 50 on the basis of the received address. The memory cell array 50 outputs data of a memory cell designated by the row and column addresses.

The clock synchronizing circuit 110 generates a data output clock signal CLKDQ in response to an external clock signal ECLK. The external clock signal ECLK serves as a reference clock signal for most commands of the semiconductor memory device 10 but the present invention is not limited thereto. Further, in the above embodiment, even though a delay locked loop (DLL) circuit is exemplified as the clock synchronizing circuit 110, it is possible to use a variety of circuits or units that can supply clocks, such as a phase locked loop (PLL) and a synchronous mirror delay (SMD).

However, in the embodiment illustrated in FIG. 1, the clock synchronizing circuit 110 includes a phase detector 112, a variable delay circuit 114, and a replica circuit 116. The clock synchronizing circuit 110 generates the data output clock signal CLKDQ whose phase precedes that of the external clock signal ECLK.

The phase detector 112 compares the phase of the data output clock signal CLKDQ with the phase of the external clock signal ECLK and controls a delay time of the variable delay circuit 114 on the basis of the phase difference. The variable delay circuit 114 delays the external clock signal ECLK for a predetermined period of time according to the control of the phase detector 112 so as to generate the data output clock signal CLKDQ. The replica circuit 116 is a circuit having a structure in which the delay time is the same as in a case in which a signal is output through a data output path, and the replica circuit 116 generates the data output clock signal CLKDQ that precedes the external clock signal ECLK by a delay time on the data output path, that is, a data out time tSAC. The data output time tSAC is a period of time needed until the data output buffer 300 outputs data. Accordingly, the clock synchronizing circuit 110 causes data DOUT to be output from the data output buffer 300 in synchronization with the external clock signal ECLK.

An internal clock generator 120 receives the external clock signal ECLK and then generates an internal clock signal PCLK. Specifically, the internal clock signal PCLK is a buffered signal of the external clock signal ECLK. Therefore, the internal clock signal PCLK has the same frequency as the external clock signal ECLK and is delayed for a predetermined period of time from the external clock signal ECLK. A swing level of the internal clock signal PCLK is a CMOS level. The internal clock signal PCLK can be used to control peripheral circuits, such as a data sense amplifier (not shown) or a data multiplexer (not shown), in the semiconductor memory device 10.

A read command circuit 130 outputs a read signal COSRD in response to the external clock signal ECLK and the read command READ CMD. Although not shown in the drawing, the read command circuit 130 may include a read command buffer. The read signal COSRD is supplied to the latency circuit 250. A mode register 140 stores a mode register set command MRS CMD input to the synchronous semiconductor memory device 10. The MRS command MRS CMD indicates a mode of the synchronous semiconductor memory device 10. CAS latency CLi ("i" is an integer) is determined by the MRS command MRS CMD. In the embodiment, even though the CAS latency is set as 5, the CAS latency is not limited to 5.

In the embodiment of the present invention, the latency control circuit 200 receives a plurality of clock control signals M0 to M3 and outputs a plurality of sampling clock signals SCLK0 to SCLK3. The latency control circuit 200 includes a clock replica circuit 220 and a sampling clock generator 240. Here, since the CAS latency is 5, the four clock control signals M0 to M3 and the four sampling clock signals SCLK0 to SCLK3 are supplied. However, when the CAS latency is "n", "n−1" clock control signals and "n−1" sampling clock signals may be supplied.

The clock replica circuit 220 delays the plurality of clock control signals M0 to M3 by a predetermined period of time and outputs a plurality of delayed clock control signals M0' to M3'. A delay time between each of the clock control signals M0 to M3 and each of the plurality of delayed clock control signals M0' to M3' is substantially equal to a sum of the period of time tSAC, which is needed until the data output buffer 300 outputs the data received from the memory cell array 50, and a period of time tREAD, which is necessary for the read command circuit 130 to output the read signal COSRD. That is, the plurality of delayed clock control signals M0' to M3' may be signals which are delayed from the plurality of clock control signals M0 to M3 by the sum of the data output delay time tSAC and the read command delay time tREAD. The clock replica circuit 220 will be described in further detail later with reference to the accompanying drawings.

The sampling clock generator 240 generates the plurality of sampling clock signals SCLK0 to SCLK3 in synchronization with the plurality of delayed clock control signals M0' to M3'. The plurality of sampling clock signals SCLK0 to SCLK3 is supplied to the latency circuit 250 and is used to store the read signal COSRD. The sampling clock generator 240 will also be described in further detail later with reference to the accompanying drawings.

The latency circuit 250 stores the read signal COSRD in response to at least one of the sampling clock signals SCLK0 to SCLK3, receives the data output clock signal CLKDQ and then generates the plurality of clock control signals M0 to M3 in a sequential manner, generates a plurality of transfer clock signals TCLK0 to TCLK3 synchronized with the plurality of clock control signals M0 to M3, and supplies a latency signal LATENCY in response to the transfer clock signals TCLK0 to TCLK3 that are associated with the sampling clock signals SCLK0 to SCLK3 used to store the read signal COSRD. The latency circuit 250 includes a clock control signal generation unit 260, a read signal storage unit 270, and a switching unit 280. The latency circuit 250 will be described in further detail later with reference to the accompanying drawings.

The data output buffer 300 receives the data output from the memory cell array 50 and then outputs the received data in response to the latency signal LATENCY output from the latency circuit 250 and the data output clock signal CLKDQ output from the clock synchronizing circuit 110. Specifically, the data output buffer 300 of the synchronous semiconductor memory device 10 is triggered by the data output clock signal CLKDQ only when the latency signal LATENCY is enabled, and thus the data is output from the data output buffer 300.

As described above, the synchronous semiconductor memory device 10 according to the above embodiment of the present invention generates a sampling clock signal by using a data output clock. Hereinafter, a process of supplying a clock control signal by using a data output clock signal, a process of supplying a delayed clock control signal by using the clock control signal, and a process of supplying a sampling clock signal synchronized with the delayed clock control signal will be described.

Figure 2A:
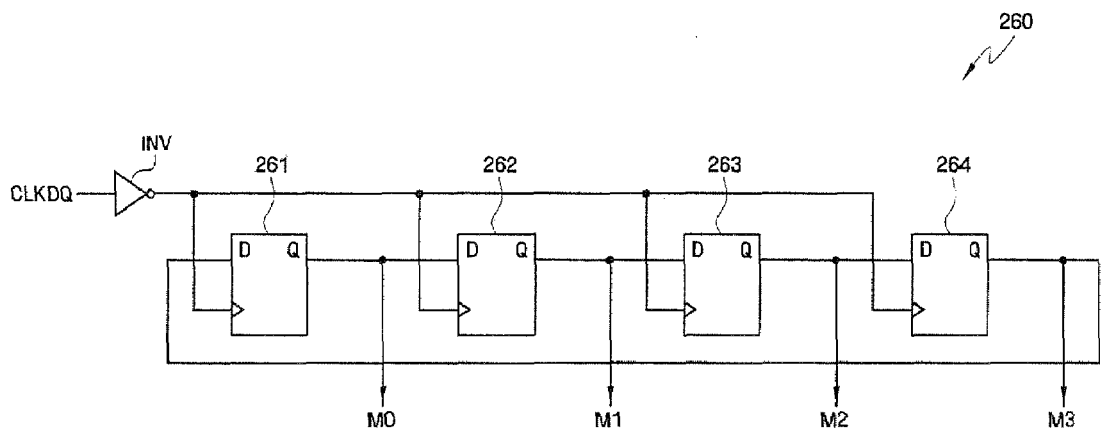
FIG. 2A is a circuit diagram illustrating a clock control signal generation unit shown in FIG. 1.
Figure 2B:
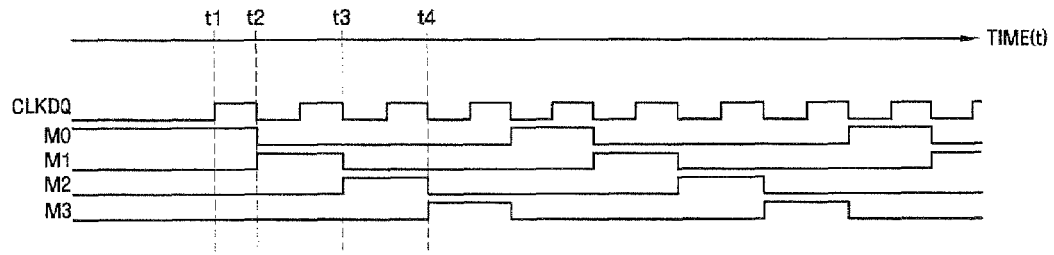
FIG. 2B is a timing diagram illustrating an operation of the clock control signal generation unit shown in FIG. 2A.

First, the process of supplying the plurality of clock control signals M0 to M3 by using the data output clock signal CLKDQ will be described with reference to FIGS. 2A and 2B. FIG. 2A is a circuit diagram illustrating the clock control signal generation unit 260. FIG. 2B is a timing diagram illustrating an operation of the clock control signal generation unit 260 shown in FIG. 2A.

Referring to FIG. 2A, the clock control signal generation unit 260 receives the data output clock signal CLKDQ and then supplies the plurality of clock control signals M0 to M3. Assuming that the CAS latency is 5, the clock control signal generation unit 260 includes flip-flops corresponding to the number of cycles which is one less than the CAS latency; that is, the first to fourth D flip-flops 261, 262, 263, and 264. Specifically, an output Q of the first D flip-flop 261 is input to the second D flip-flop 262, an output Q of the second D flip-flop 262 is input to the third D flip-flop 263, an output Q of the third D flip-flop 263 is input to the fourth D flip-flop 264, and an output Q of the last fourth D flip-flop 264 is input to the first D flip-flop 261. In addition, an inverted signal of the data output clock signal CLKDQ is input to clock terminals of the first to fourth D flip-flops 261, 262, 263, and 264. In addition, the outputs Q of the first to fourth D flip-flops 261, 262, 263, and 264 serve as the clock control signals M0 to M3, respectively.

Next, the operation of the clock control signal generation unit 260 will be described with reference to FIG. 2B. Before time t1, the first to fourth D flip-flops 261, 262, 263, and 264 are set as 1 (SET), 0 (RESET), 0 (RESET), and 0 (RESET), respectively.

Subsequently, since the first to fourth D flip-flops 261, 262, 263, and 264 operate in synchronization with the inverted signal of the data output clock signal CLKDQ, an input D of each of the first to fourth D flip-flops 261, 262, 263, and 264 is output as the output Q at every falling edge of the data output clock signal CLKDQ. Therefore, output values of the first to fourth D flip-flops 261, 262, 263, and 264 are sequentially shifted, for example, from an initial value of '1000' to other values of '0100', '0010', and '0001' at time t2, t3, and t4 shown in FIG. 2B. In this way, the sequential clock control signals M0 to M3 are generated.

The first clock control signal M0 is enabled in response to the data output clock signal CLKDQ. When the CAS latency is 5, the clock control signal generation unit 260 includes flip-flops corresponding to the number of cycles which is one less than the CAS latency. Accordingly, the clock control signals M0 to M3 are sequentially generated every four cycles of the data output clock signal CLKDQ.

Figure 3A:
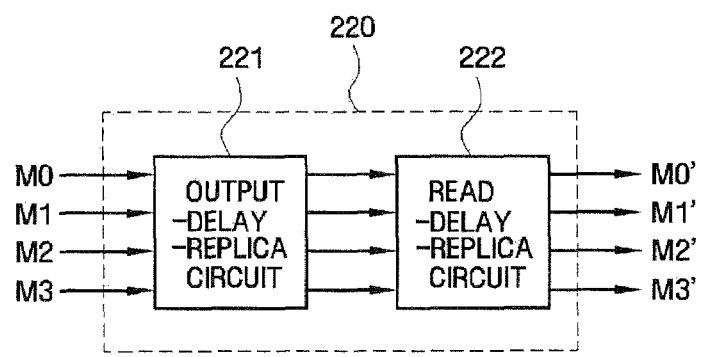
FIG. 3A is a block diagram illustrating a clock replica circuit shown in FIG. 1.

FIG. 3A is a block diagram illustrating the clock replica circuit 220. A process of generating the delayed clock control signals M0' to M3' by using the clock control signals M0 to M3 will be described with reference to FIGS. 3A and 3B.

The clock replica circuit 220 includes an output delay replica circuit 221 and a read delay replica circuit 222.

The output delay replica circuit 221 receives the plurality of clock control signals M0 to M3, delays the plurality of clock control signals M0 to M3 by the period of time tSAC needed until data is output from the output buffer, and supplies the delayed clock control signals M0 to M3 to the read delay replica circuit 222.

The read delay replica circuit 222 receives the signals output from the output delay replica circuit 221 and then delays the signals by the period of time tREAD necessary for the read command to be transmitted.

Figure 3B:
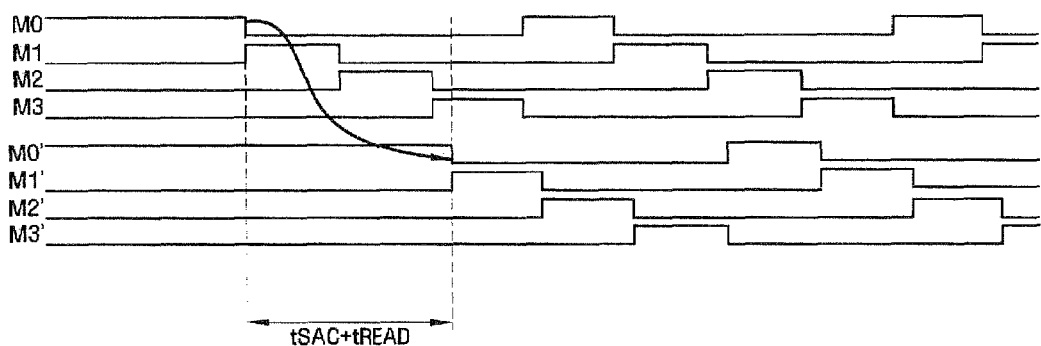
FIG. 3B is a timing diagram illustrating an operation of the clock replica circuit shown in FIG. 3A.

The clock control signals M0 to M3 which have passed through the clock replica circuit 220 become the delayed clock control signals M0' to M3'. Accordingly, the delayed clock control signals M0' to M3' are signals delayed from the clock control signals M0 to M3 by the sum (tSAC+tREAD) of the output delay time and the read command delay time. That is, as shown in FIG. 3B, the plurality of delayed clock control signals M0' to M3' is generated after a predetermined delay time, specifically, the sum (tSAC+tREAD) of the output delay time and the read command delay time after the plurality of clock control signals M0 to M3 are sequentially generated.

Figure 4A:
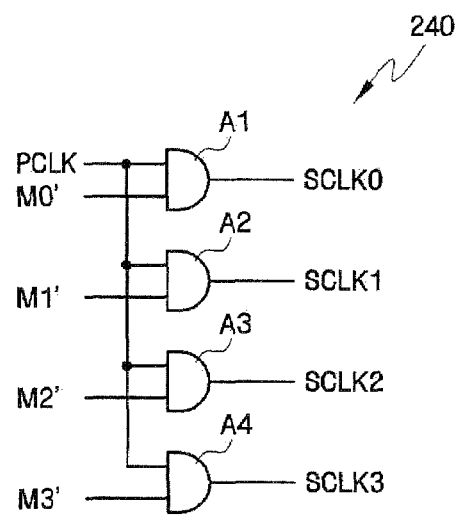
FIG. 4A is a circuit diagram illustrating a sampling clock generator shown in FIG. 1.
Figure 4B:
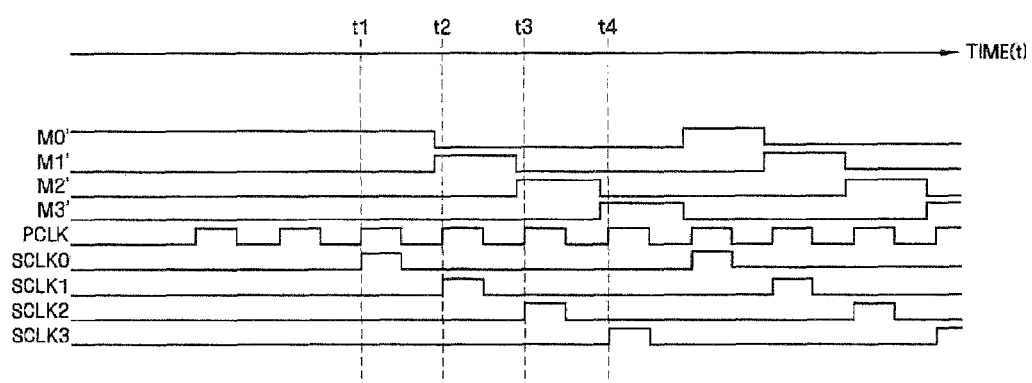
FIG. 4B is a timing diagram illustrating an operation of the sampling clock generator shown in FIG. 4A.

FIG. 4A is a circuit diagram illustrating the sampling clock generator 240. FIG. 4B is a timing diagram illustrating an operation of the sampling clock generator 240 shown in FIG. 4A. Referring to FIGS. 4A and 4B, it will be described how the sampling clock generator 240 receives the plurality of delayed clock control signals M0' to M3' and then supplies the plurality of sampling clock signals SCLK0 to SCLK3.

A plurality of AND operators A1 to A4 receive the internal clock signal PCLK and the delayed clock control signals M0' to M3' and then generate the plurality of sampling clock signals SCLK0 to SCLK3, respectively. That is, the plurality of sampling clock signals SCLK0 to SCLK3 is obtained by sequentially sampling the plurality of delayed clock control signals M0' to M3' in synchronization with the internal clock signal PCLK, for example, at time t1, t2, t3, and t4 shown in FIG. 4B.

Figure 5A:
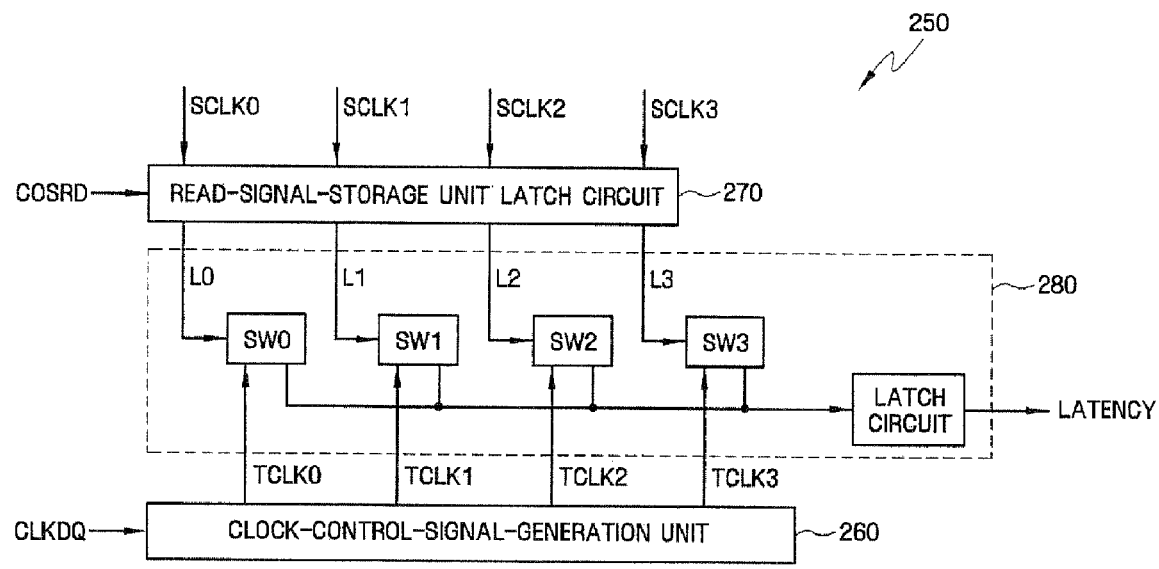
FIG. 5A is a block diagram illustrating a latency circuit shown in FIG. 1.
Figure 5B:
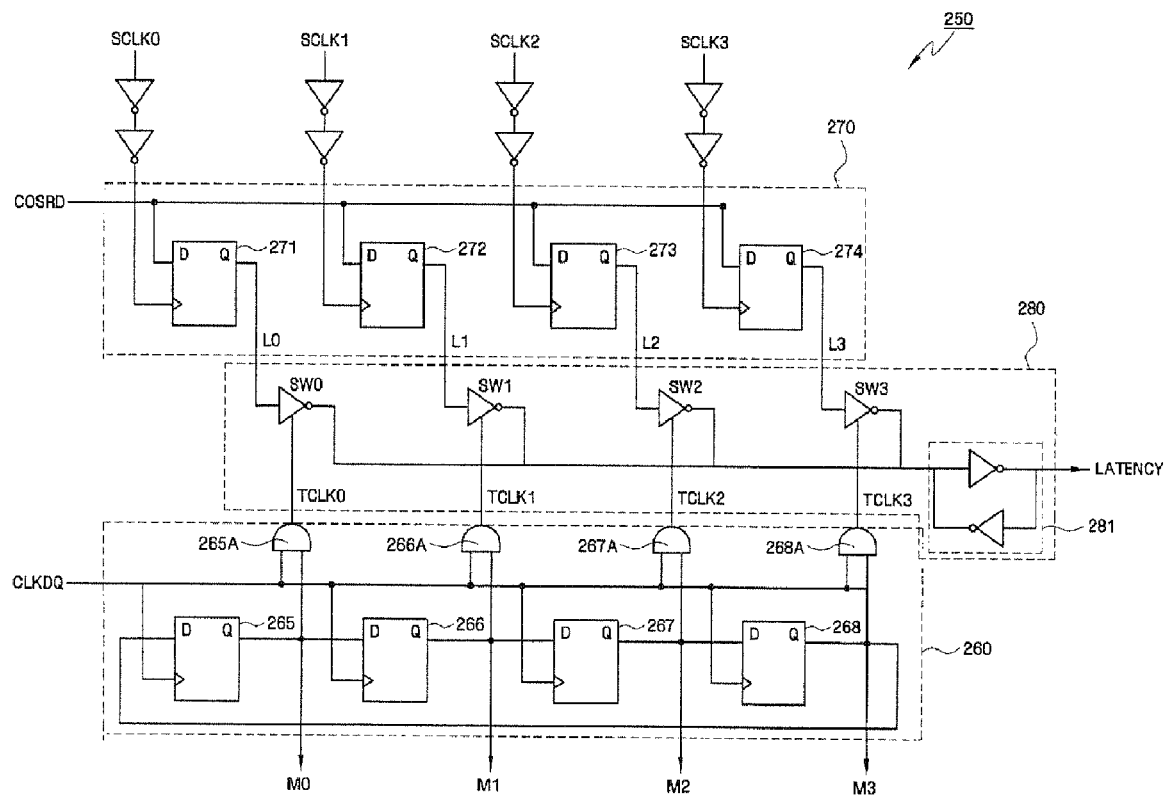
FIG. 5B is a detailed view illustrating the latency circuit shown in FIG. 1.

FIG. 5A is a block diagram illustrating the latency circuit 250, and FIG. 5B is a detailed view illustrating the latency circuit 250. Referring to FIGS. 5A and 5B, it will be described how the latency signal LATENCY is output by means of the plurality of sampling clock signals SCLK0 to SCLK3, the plurality of transfer clock signals TCLK0 to TCLK3, and the read signal COSRD.

As described above, the latency circuit 250 includes the clock control signal generation unit 260, the read signal storage unit 270, and the switching unit 280.

The clock control signal generation unit 260 sequentially generates the plurality of clock control signals M0 to M3 in synchronization with the data output clock signal CLKDQ. The clock control signal generation unit 260 further includes a plurality of flip-flops 265, 266, 267, and 268, as well as a plurality of AND operators 265A, 266A, 267A, and 268A. The plurality of AND operators 265A, 266A, 267A, and 268A receive the data output clock signal CLKDQ and the plurality of clock control signals M0 to M3, each of which is an output of each flip-flop 265-268, and then generates the plurality of transfer clock signals TCLK0 to TCLK3, respectively. That is, each of the plurality of transfer clock signals TCLK0 to TCLK3 is generated by performing an AND operation on each of the plurality of clock control signals M0 to M3 and pulses of the data output clock signal CLKDQ triggered while the plurality of clock control signals M0 to M3 are at high levels. Accordingly, the data output clock signal CLKDQ has the same phase as each of the plurality of transfer clock signals TCLK0 to TCLK3.

The read signal storage unit 270 receives the read signal COSRD and the sampling clock signals SCLK0 to SCLK3 and stores the read signal COSRD in response to at least one of the sampling clock signals SCLK0 to SCLK3 so as to generate a plurality of latch signals L0 to L3. The read signal storage unit 270 includes a plurality of flip-flops 271, 272, 273, and 274. The plurality of flip-flops 271, 272, 273, and 274 are connected in parallel to one another. Each of the plurality of sampling clock signals SCLK0 to SCLK3 is input to a clock terminal of each of the flip-flops 271, 272, 273, and 274, and the read signal COSRD is supplied to each input terminal D. In addition, each of the flip-flops 271, 272, 273, and 274 stores the read signal COSRD as each of the plurality of latch signals L0 to L3 in response to each of the plurality of sampling clock signals SCLK0 to SCLK3. That is, the read signal storage unit 270 stores the read signal COSRD as the first to fourth latch signals L0 to L3 while the plurality of sampling clock signals SCLK0 to SCLK3 are at high levels.

The switching unit 280 outputs the latency signal LATENCY in response to the plurality of latch signals L0 to L3 and the transfer clock signals TCLK0 to TCLK3. In other words, a plurality of switches SW0 to SW3 receive the plurality of latch signals L0 to L3 and the plurality of transfer clock signals TCLK0 to TCLK3 and then supply the plurality of latch signals L0 to L3 to a latch unit 281. Here, a tri-state inverter is used as each of the switches SW0 to SW3; however, the switches SW0 to SW3 are not limited to three-phase inverters.

Hereinafter, an operation of each of the switches SW0 to SW3 will be described.

When each of the transfer clock signals TCLK0 to TCLK3 changes to a high level, each of the switches SW0 to SW3 is turned on and thus each of the latch signals L0 to L3 is input to each of the switches SW0 to SW3. The latch unit 281 latches the data, which is transmitted through the switches SW0 to SW3, as the latency signal LATENCY.

Here, the latency circuit 250 can supply a plurality of latency signals LATENCY which are different depending on the CAS latency CLi supplied from the mode register (140 in FIG. 1). Specifically, if the CAS latency CLi is large, a latency signal LATENCY of which a delay time is longer than that of the read signal COSRD is supplied, and if the CAS latency CLi is small, a latency signal LATENCY of which a delay time is shorter than that of the read signal COSRD is supplied.

Figure 6:
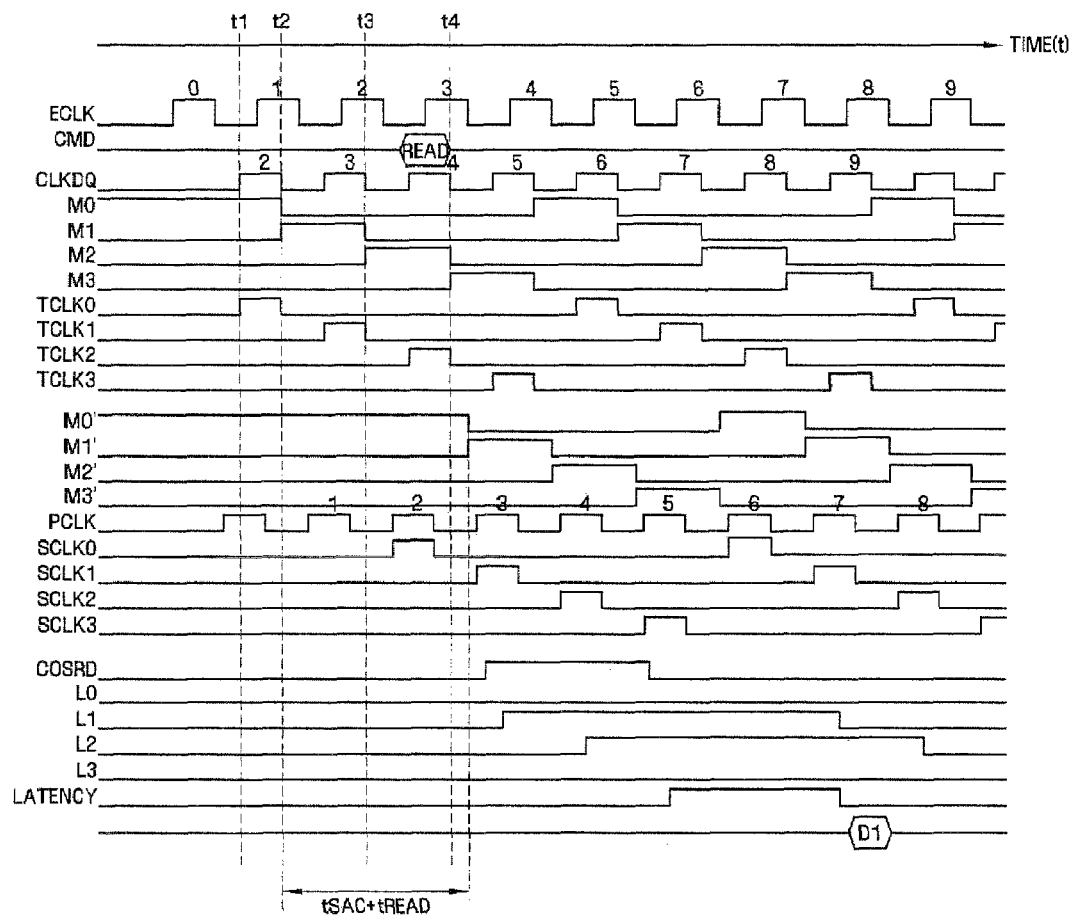
FIG. 6 is a timing diagram illustrating an operation of the synchronous semiconductor memory device according to the embodiment of the present invention shown in FIG. 1.

FIG. 6 is a timing diagram illustrating an operation of the synchronous semiconductor memory device 10 according to the embodiment of the present invention. Hereinafter, the operation of the synchronous semiconductor memory device 10 according to the embodiment of the present invention will be described with reference to FIGS. 1 to 6. Each of the external clock signal ECLK, the data output clock signal CLKDQ, and the internal clock signal PCLK is affixed with numbers, such as 0, 1, 2, or 3, so that the relationship therebetween can be easily understood.

At time t1, the data output clock signal CLKDQ whose phase precedes that of the external clock signal ECLK is generated. The data output clock signal CLKDQ precedes the external clock signal ECLK by the period of time tSAC. Here, the period of time tSAC means a period of time needed until the data output buffer 300 outputs the data received from the memory cell array 50.

The internal clock signal PCLK is generated by buffering the external clock signal ECLK. Accordingly, the internal clock signal PCLK may be delayed for a predetermined period of time from the external clock signal ECLK.

Furthermore, the plurality of clock control signals M0 to M3 is supplied from the clock control signal generation unit 260. The plurality of clock control signals M0 to M3 is sequentially generated in synchronization with the data output clock signal CLKDQ, for example, at times t2, t3, and t4.

The plurality of clock control signals M0 to M3 is further delayed for a predetermined period of time by the clock replica circuit 220 to generate the plurality of delayed clock control signals M0' to M3'. The delayed clock control signals M0' to M3' are respectively delayed from the clock control signals M0 to M3 by the predetermined period of time, specifically, the sum (tSAC+tREAD) of the output delay time and the read command delay time. By synchronizing the delay time, it is possible to maintain the proper timing relationship between the sampling clock signals SCLK0 to SCLK3 and the transfer clock signals TCLK0 to TCLK3.

On the other hand, each of the plurality of transfer clock signals TCLK0 to TCLK3 is generated in synchronization with each of the plurality of clock control signals M0 to M3 and the data output clock signal CLKDQ. Each of the plurality of transfer clock signals TCLK0 to TCLK3 is generated by performing an AND operation on each of the clock control signals M0 to M3 and the data output clock signal CLKDQ. Further, each of the transfer clock signals TCLK0 to TCLK3 is a signal which is synchronized with the data output clock signal CLKDQ and has a period four times that of the data output clock signal CLKDQ. Additionally, the transfer clock signals TCLK0 to TCLK3 are sequentially generated from time t1.

The sampling clock generator 240 sequentially generates the plurality of sampling clock signals SCLK0 to SCLK3 by performing an AND operation on the plurality of delayed clock control signals M0' to M3' and the internal clock signal PCLK. Accordingly, the plurality of sampling clock signals SCLK0 to SCLK3 is generated, from a second pulse 2 of the internal clock signal PCLK, in synchronization with the internal clock signal PCLK.

When the read command READ CMD is input in synchronization with the external clock signal ECLK, the read signal COSRD is enabled after the period of time tREAD from when the read command READ CMD is input. For the convenience of explanation, a cycle of the external clock signal ECLK while the read command READ CMD is input is assumed to be a third pulse 3. In addition, it is also assumed that the read signal COSRD is activated during two cycles of the external clock signal ECLK.

The read signal COSRD is stored by the first to fourth latch signals L0 to L3 while the first to fourth sampling clock signals SCLK0 to SCLK3 are at high levels. Here, since the read signal COSRD is at a high level while the second and third sampling clock signals SCLK1 and SCLK2 are at high levels, the second and third latch signals L1 and L2 are maintained as high levels. The second and third latch signals L1 and L2 hold previous data until the next latch starts by the second and third sampling clock signals SCLK1 and SCLK2, and accordingly, the read signal COSRD which is at a high level is latched during about four clock cycles.

Each of the first to fourth latch signals L0 to L3 causes the latency signal LATENCY to be generated in response to each of the transfer clock signals TCLK0 to TCLK3. Each of the transfer clock signals TCLK0 to TCLK3 causes each of the latch signals L0 to L3 to be transmitted. Accordingly, the first transfer clock signal TCLK0 which is activated causes a value of the first latch signal L0, which is at a low level, to be transmitted, and the second transfer clock signal TCLK1 causes a value of the second latch signal L1 to be transmitted. In this way, the latency signal LATENCY is generated by the second and third latch signals L1 and L2, which are at high levels, transmitted by the second and third transfer clock signals TCLK1 and TCLK2.

Since the latency signal LATENCY is enabled, the data output buffer 300 outputs first data D1 in response to the data output clock signal CLKDQ. Since the CAS latency is 5, it can be seen that the first data D1 is output at a pulse 8 of the external clock signal ECLK, the pulse 8 being generated five cycles after the read command READ CMD is input at a pulse 3 of the external clock signal ECLK. That is, the data D1 is output in synchronization with a rising edge of the data output clock signal CLKDQ after the latency signal LATENCY is activated.

In the embodiment of the present invention, the CAS latency is set as 5. Therefore, if the read command READ CMD is input at a third clock of the external clock signal ECLK, data will be read out at an eighth clock of the external clock signal ECLK. In order to do so, the latency signal LATENCY should be at a high level at the eighth cycle of the data output clock signal CLKDQ which is a reference signal with respect to output data. However, if the latency signal LATENCY is activated in precise synchronization with the eighth cycle of the data output clock signal CLKDQ, an operation failure may occur. For this reason, in order to perform a stable operation, the latency signal LATENCY needs to be activated a predetermined period of time before the eighth cycle of the data output clock signal CLKDQ starts. In other words, the latency signal LATENCY should be activated at a time which is delayed for a predetermined period of time from a seventh cycle of the data output clock signal CLKDQ and is earlier than the eighth cycle of the data output clock signal CLKDQ.

Therefore, a sampling clock signal SCLK whose delay time is substantially equal to a sum of the delay time tREAD while the read signal COSRD is generated, and a delay time while data is read out through a data buffer is used. In the related art, the sampling clock signal SCLK is generated through a variable delay circuit. However, in the embodiment of the present invention, the sampling clock signal SCLK is generated by causing a clock control signal to pass through a clock replica circuit without using the variable delay circuit.

The sampling clock signal SCLK latches and stores the read signal COSRD, and then generates the latency signal LATENCY by synchronizing the latched read signal COSRD with the desired data output clock signal CLKDQ. Further, since the plurality of sampling clock signals SCLK0 to SCLK3 and the plurality of transfer clock signals TCLK0 to TCLK3 are signals supplied in synchronization with the data output clock signal CLKDQ, the relationship between the sampling clock signal SCLK and a transfer clock signal TCLK is more stable than in a case when the signals are supplied by using each variable delay circuit. In other words, since an early-stage operation of the variable delay circuit is not stable due to a characteristic of the variable delay circuit, a clock signal generated in an early stage may be unstable. In addition, it is difficult to maintain the proper timing so as to synchronize signals that are obtained by using different variable delay circuits.

In the embodiment of the present invention, since the sampling clock signal is generated by using the clock control signal synchronized with the data output clock signal, it is possible to provide a synchronous semiconductor memory device in which a latency control is improved.

Figure 7:
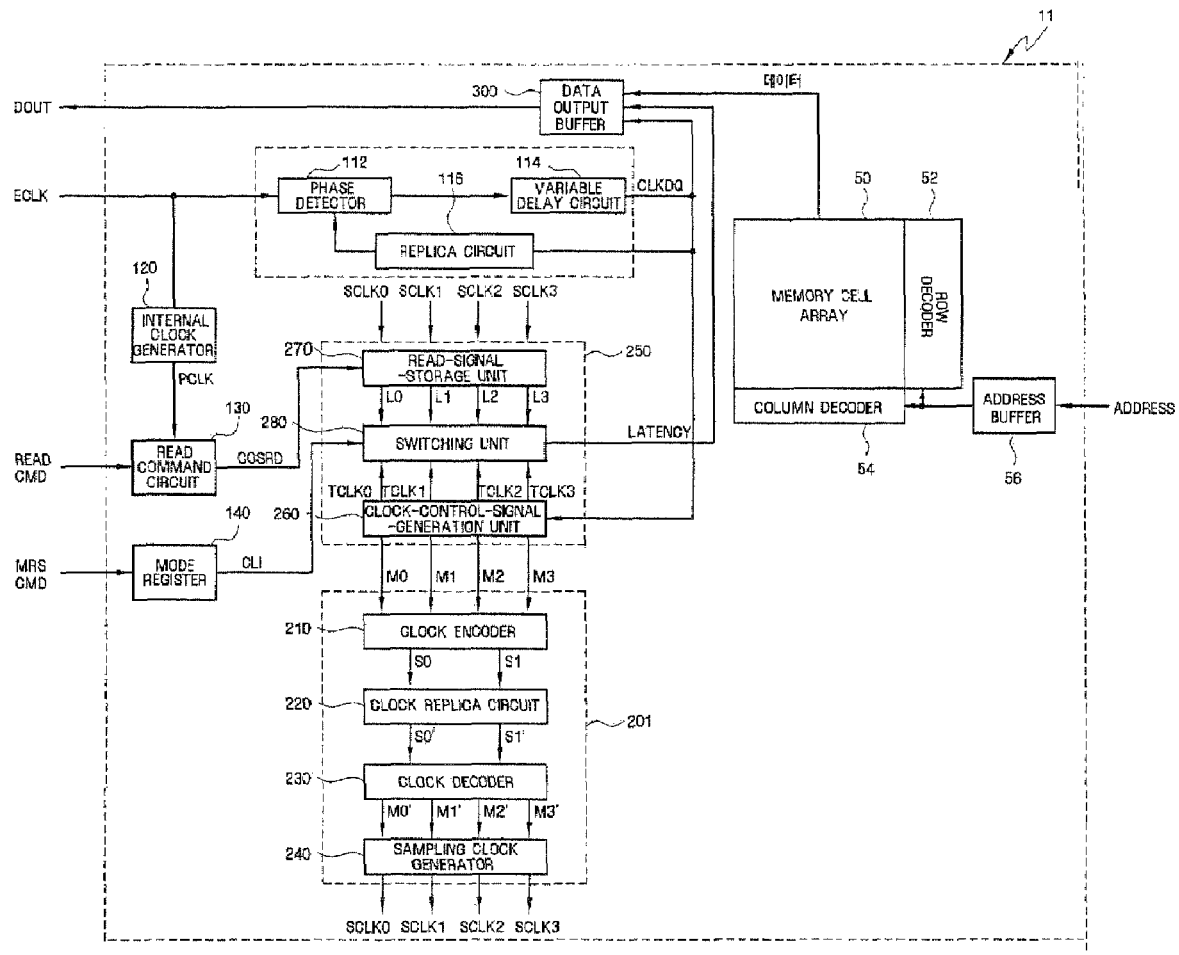
FIG. 7 is a block diagram illustrating a synchronous semiconductor memory device according to another embodiment of the present invention.

FIG. 7 is a block diagram illustrating a synchronous semiconductor memory device according to another embodiment of the present invention. In FIG. 7, substantially the same components as in FIG. 1 are denoted by the same reference numerals, and detailed explanation thereof will be omitted.

Referring to FIG. 7, in a synchronous semiconductor memory device 11, a latency control circuit 201 further includes a clock encoder 210 and a clock decoder 230. The clock encoder 210 receives a plurality of clock control signals M0 to M3 and then generates encoded signals S0 and S1 by encoding the received clock control signals M0 to M3. The clock replica circuit 220 receives the encoded signals S0 and S1, delays the encoded signals S0 and S1 by the predetermined period of time (tREAD+tSAC), and outputs delayed encoded signals S0' and S1'. The clock decoder 230 decodes the delayed encoded signals S0' and S1' that have been received and outputs the plurality of delayed clock control signals M0' to M3'.

In this embodiment, internal signals are simplified while the sampling clock signals SCLK0 to SCLK3 are generated by using the clock control signals M0 to M3. Here, even though the clock encoder 210 and the clock decoder 230 are used in order to simplify the internal signals, the sampling clock signals SCLK0 to SCLK3 should be delayed for a predetermined period of time from the transfer clock signals TCLK0 to TCLK3 or the data output clock signal CLKDQ. Accordingly, the encoded signals S0 and S1 pass through the clock replica circuit 220. As a result, due to the delayed clock control signals M0' to M3' which have passed through the clock encoder 210 and the clock decoder 230, it is possible to supply the sampling clock signals SCLK0 to SCLK3 which are delayed for a predetermined period of time from the data output clock signal CLKDQ.

Figure 8:
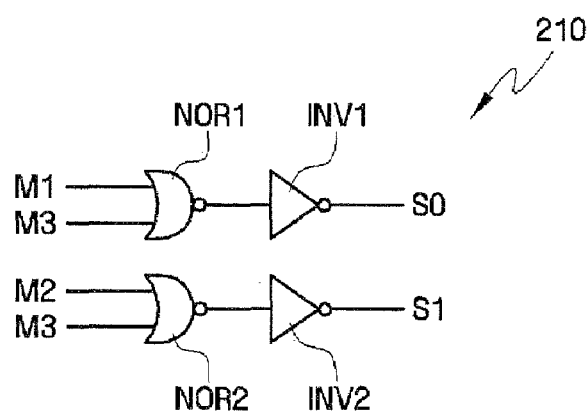
FIG. 8 is a circuit diagram illustrating a clock encoder shown in FIG. 7.

FIG. 8 is a detailed view illustrating the clock encoder 210. The clock encoder 210 is a circuit that receives the plurality of clock control signals M0 to M3 and then generates the encoded signals S0 and S1 by encoding the received clock control signals M0 to M3. The second clock control signal M1 and the fourth clock control signal M3 are input to a first NOR gate NOR1 and then a first encoded signal S0 is output through a first inverter INV1. In addition, the third clock control signal M2 and the fourth clock control signal M3 are input to a second NOR gate NOR2 and then a second encoded signal S1 is output through a second inverter INV2.

Figure 9:
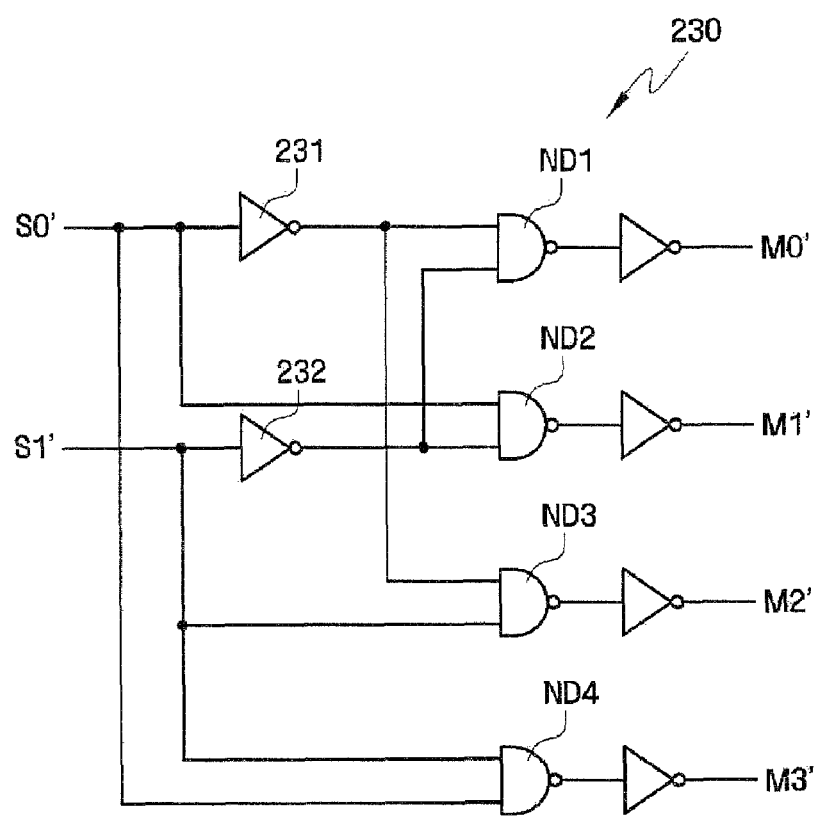
FIG. 9 is a circuit diagram illustrating a clock decoder shown in FIG. 7.

FIG. 9 is a detailed view illustrating the clock decoder 230. The clock decoder 230 is a circuit that receives two input signals and then supplies four output signals. The clock decoder 230 receives the delayed encoded signals S0' and S1', which are obtained by delaying the first and second encoded signals S0 and S1 shown in FIG. 8 by the predetermined period of time (tSAC+tREAD), and then supplies the plurality of delayed clock control signals M0' to M3'. A circuit of the clock decoder 230 is a typical decoder circuit and includes inverters 231 and 232 by which the delayed encoded signals S0' and S1' become signals corresponding to '00', '01', '10', and '11'. In addition, NAND gates ND1 to ND4 receive logic levels of the delayed encoded signals S0' and S1' and then supply the four delayed clock control signals M0' to M3', respectively.

As described above, the synchronous semiconductor memory device 10 or 11 has at least one of the following advantages.

First, a sampling clock signal that is synchronized with a data output clock signal can be generated without using a separate variable delay circuit.

Second, since the sampling clock signal is synchronized with the data output clock signal, the relationship between the sampling clock signal and a transfer clock signal generated in response to the data output clock signal is stable.

Third, since the relationship between the sampling clock signal and the transfer clock signal is stable, a stable circuit operation of the synchronous semiconductor memory device is realized.

Although the present invention has been described in connection with the exemplary embodiments of the present invention, it will be apparent to those skilled in the art that various modifications and changes may be made thereto without departing from the scope and spirit of the invention. Therefore, it should be understood that the above embodiments are not restrictive, but illustrative in all aspects.

What is claimed is:

1. A semiconductor device comprising:
a clock synchronizing circuit receiving an external clock signal and outputting a data output clock signal;
a latency control circuit delaying at least one clock control signal by the sum of an output delay time and a read command delay time so as to generate at least one sampling clock signal synchronized with the at least one delayed clock control signal; and
a latency circuit storing a read signal in response to the at least one sampling clock signal, receiving the data output clock signal to generate the at least one clock control signal in a sequential manner, generating at least one transfer clock signal synchronized with the at least one clock control signal, and supplying a latency signal in response to the at least one transfer clock signal associated with the at least one sampling clock signal used to store the read signal.

2. The semiconductor device of claim 1, wherein the latency circuit comprises a shift register in which at least one flip-flop corresponding to the at least one clock control signal is connected in parallel.

3. The semiconductor device of claim 1, further comprising an internal clock generation circuit receiving the external clock signal and generating an internal clock signal, wherein each of the at least one sampling clock signals is generated by performing an AND operation on each of the at least delayed clock control signals and the internal clock signal.

4. The semiconductor device of claim 1, wherein each of the at least one transfer clock signals is generated by performing an AND operation on each of the at least one clock control signals and the data output clock signal.

5. A synchronous semiconductor memory device comprising:
a clock synchronizing circuit receiving an external clock signal and outputting a data output clock signal;
a latency circuit storing a read signal in response to a plurality of sampling clock signals, receiving the data output clock signal and then generating a plurality of clock control signals in a sequential manner, generating a plurality of transfer clock signals synchronized with the plurality of clock control signals, and supplying a latency signal in response to the transfer clock signals associated with the sampling clock signals used to store the read signal;
an internal clock generation circuit receiving the external clock signal and generating an internal clock signal;
a clock replica circuit delaying the plurality of clock control signals by the sum of an output delay time and a read command delay time so as to output delayed clock control signals; and
a sampling clock generator generating the sampling clock signals by performing an AND operation on the internal clock signal and each of the delayed clock control signals.

6. The synchronous semiconductor memory device of claim 5, wherein the latency circuit comprises a plurality of flip-flops connected in parallel to one another, each of the plurality of flip-flops receiving each of the sampling clock signals and latching the read signal.

7. The synchronous semiconductor memory device of claim 6, wherein the number of flip-flops is one less than CAS latency.

8. The synchronous semiconductor memory device of claim 5, wherein the latency circuit comprises:
a shift register having a plurality of flip-flops connected in parallel to one another, each of the plurality of flip-flops receiving the data output clock signal and generating a corresponding one of the plurality of clock control signals; and
a plurality of AND operators outputting the transfer clock signals by performing an AND operation on each of the clock control signals and the data output clock signal.

9. The synchronous semiconductor memory device of claim 5, wherein the latency circuit comprises a plurality of switches, each of the plurality of switches supplying the stored read signal as the latency signal in response to each of the transfer clock signals associated with each of the sampling clock signals used to store the read signal.

10. The synchronous semiconductor memory device of claim 5 further comprising:
a clock encoder supplying a plurality of encoded clock signals by encoding the plurality of clock control signals, where the clock replica circuit delays the plurality of encoded clock signals by the sum of output delay time and read command delay time so as to output delayed encoded clock signals; and
a clock decoder supplying delayed clock control signals to the sampling clock generator by decoding the delayed encoded clock signals.

11. A synchronous semiconductor memory device comprising:
a clock synchronizing circuit receiving an external clock signal and generating a data output clock signal;
an internal clock generation circuit receiving the external clock signal and generating an internal clock signal;
a clock control signal generation unit receiving the data output clock signal and generating a plurality of clock control signals and a plurality of transfer clock signals synchronized with the plurality of clock control signals;
a clock replica circuit delaying the plurality of clock control signals by the sum of an output delay time and a read command delay time to generate delayed clock control signals;
a sampling clock generator receiving the delayed clock control signals and the internal clock signal and generating a plurality of sampling clock signals;

a read signal storage unit storing a read signal in response to the sampling clock signals and generating a plurality of read latch signals;

a switching unit receiving the transfer clock signals and read latch signals and generating a latency signal; and a data output buffer outputting data from a memory cell array in response to the data output signal and the latency signal.

12. The synchronous semiconductor memory device of claim 11, wherein the read signal storage unit comprises a plurality of flip-flops connected in parallel to one another, each of the plurality of flip-flops receiving each of the sampling clock signals and latching the read signal to generate the plurality of read latch signals.

13. The synchronous semiconductor memory device of claim 12, wherein the number of flip-flops is one less than CAS latency.

14. The synchronous semiconductor memory device of claim 11, wherein the clock control signal generation unit comprises:

a shift register having a plurality of flip-flops connected in parallel to one another, each of the plurality of flip-flops receiving the data output clock signal and then generating a corresponding one of the plurality of clock control signals; and a plurality of AND operators outputting the transfer clock signals by performing an AND operation on each of the clock control signals and the data output clock signal.

15. The synchronous semiconductor memory device of claim 11, wherein the switching unit comprises a plurality of switches, each of the plurality of switches supplying the read latch signals as the latency signal in response to each of the transfer clock signals associated with each of the sampling clock signals used to store the read signal.

16. The synchronous semiconductor memory device of claim 11, wherein the sampling clock generator generates the sampling clock signals by performing an AND operation on the internal clock signal and each of the delayed clock control signals.

17. The synchronous semiconductor memory device of claim 11 further comprising:

a clock encoder supplying a plurality of encoded clock signals by encoding the plurality of clock control signals, where the clock replica circuit delays the plurality of encoded clock signals by the sum of output delay time and read command delay time so as to output delayed encoded clock signals; and a clock decoder supplying delayed clock control signals to the sampling clock generator by decoding the delayed encoded clock signals.

18. A method comprising:

receiving an external clock signal;

generating a data output clock signal in response to the received external clock signal;

delaying at least one clock control signal by the sum of an output delay time and a read command delay time;

generating at least one sampling clock signal synchronized with the at least one delayed clock control signal from the delayed at least one clock control signal;

storing a read signal in response to the at least one sampling clock signal;

receiving the data output clock signal to generated that at least one clock control signal in a sequential manner;

generating at least one transfer clock signal synchronized with the at least one clock control signal; and supplying a latency signal to a data buffer to output synchronized memory data in response to the at least one transfer clock signal associated with the at least one sampling clock signal used to store the read signal.

19. The method of claim 18, further comprising generating an internal clock signal, where each of the at least one sampling clock signals is generated by performing an AND operation on each of the at least delayed clock control signals and the internal clock signal.

20. The method of claim 18, wherein generating the at least one transfer clock signal comprises performing an AND operation on each of the at least one clock control signals and the data output clock signal.

* * * * *